(12) United States Patent
Mohanty et al.

(10) Patent No.: US 7,137,087 B1
(45) Date of Patent: Nov. 14, 2006

(54) INTEGRATED CIRCUIT VERIFICATION SCHEME

(75) Inventors: Purna Mohanty, Santa Clara, CA (US); Sivam Thangavelu, San Jose, CA (US); Vivek Jambhekar, Mountain View, CA (US)

(73) Assignee: Adaptec, Inc., Milpitas, CA (US)

( * ) Notice: Subject to any disclaimer, the term of this patent is extended or adjusted under 35 U.S.C. 154(b) by 0 days.

(21) Appl. No.: 10/645,789

(22) Filed: Aug. 20, 2003

(51) Int. Cl.
*G06F 17/50* (2006.01)

(52) U.S. Cl. .............................. 716/5; 716/4
(58) Field of Classification Search .............. 716/5, 716/4
See application file for complete search history.

(56) References Cited

U.S. PATENT DOCUMENTS

| | | | | |
|---|---|---|---|---|
| 5,437,037 A * | 7/1995 | Furuichi | ...................... | 717/146 |
| 5,838,948 A * | 11/1998 | Bunza | ......................... | 703/27 |
| 5,940,779 A * | 8/1999 | Gaitonde et al. | ............. | 702/60 |
| 6,088,823 A * | 7/2000 | Ayres et al. | ................ | 714/733 |
| 6,167,363 A * | 12/2000 | Stapleton | ..................... | 703/14 |
| 6,324,671 B1 * | 11/2001 | Ratzel et al. | .................. | 716/1 |
| 6,427,224 B1 * | 7/2002 | Devins et al. | ................. | 716/4 |
| 6,466,898 B1 * | 10/2002 | Chan | ........................... | 703/17 |
| 6,539,520 B1 * | 3/2003 | Tiong et al. | ................... | 716/3 |
| 6,701,491 B1 * | 3/2004 | Yang | ............................. | 716/4 |
| 6,813,599 B1 * | 11/2004 | Court et al. | .................. | 703/14 |
| 6,851,102 B1 * | 2/2005 | Tsuchiya | ..................... | 716/18 |
| 2004/0049753 A1* | 3/2004 | Kabuo | ............................ | 716/6 |
| 2004/0128641 A1* | 7/2004 | Broberg, III et al. | ......... | 716/18 |

* cited by examiner

*Primary Examiner*—Sun James Lin
(74) *Attorney, Agent, or Firm*—Martine Penilla & Gencarella, LLP (57) ABSTRACT

A method for minimizing compilation time of a test case during development testing of an integrated circuit is provided. The method initiates with identifying a test case. The test case is associated with the tasks and the tasks are written as text files. Then, a file associated with the test case is generated. Next, a sequence of the tasks of the file is determined. Then, hardware description language (HDL) tasks, associated with the tasks of the file according to the sequence, are identified. Next, a simulation of an integrated circuit is performed through the HDL tasks. A computer readable medium having program instructions for minimizing compilation time of a test case during development testing of an integrated circuit and a system for testing an integrated circuit design are also provided.

20 Claims, 6 Drawing Sheets

INTEGRATED CIRCUIT VERIFICATION SCHEME

CROSS REFERENCE TO RELATED APPLICATIONS

This application is related to U.S. patent application Ser. No. 10/645,729, filed on the same day as the instant application and entitled "METHOD AND APPARATUS FOR ACCELERATING TEST CASE DEVELOPMENT." This application is hereby incorporated by reference in its entirety.

BACKGROUND OF THE INVENTION

1. Field of the Invention

The present invention relates generally to chip design schemes, and more specifically to application specific integrated circuit (ASIC) validation schemes that reduce the validation time without sacrificing quality.

2. Description of the Related Art

Development timelines for integrated circuits (ICs) are constantly being evaluated in order to identify efficiencies for reducing the development timeline in order to make the IC available to the market as fast as possible. At the design stage for an integrated circuit, a circuit design is typically represented as circuit data in a hardware description language (HDL). From the HDL, the circuit design can be mapped (through suitable processing) into an actual hardware design for fabrication in an integrated circuit. Standards exist for HDLs, e.g., Verilog standards.

The testing of circuit designs prior to fabrication in an integrated circuit is referred to in the art as verification and validation, and represents an important step in the design process for an integrated circuit. With the complexity of circuits increasing continuously, it is impossible to guarantee the proper operation of a design without undergoing an extensive prior verification and validation of the design. The HDL-based design methodology requires the user to describe the behavior of a system which may then be simulated (a process referred to as Register Transfer Level (RTL) simulation) to determine whether it will function as desired. The design is then synthesized to create a logical netlist that can be implemented within a particular Programmable Logic Device (PLD) or a particular PLD vendor's device group. Assuming that neither the synthesis or the design implementation processes alter the behavior of the design, RTL simulation provides the designer with insight into the functionality and behavior of the implemented device before the costly and time consuming synthesis and design implementation processes take place. If accurate, RTL simulation represents a quick and efficient means of validating a design's (and ultimately, a programmed device's) behavior.

During the validation process, complete testcases are created as a macrolevel Verilog task. The test cases are compiled along with the testbench and the design. And the simulation is then run. Once the simulation is run it is determined whether the goal of the test case is met. If the goal of the test case is not met, then the RTL is checked. If the RTL check is satisfactory, then the tasks defining the test case are adjusted. It should be appreciated that this process is iterative until the desired tasks for the testcase are determined. At each iteration, the newly defined testcase must be compiled, which consumes CPU resources of the computer system running a commercially available simulation program, e.g., a verilog based simulation program, as well as seat licenses for the simulation program.

As licenses are generally structured to allow a user to perform a compilation or a simulation, and not both at the same time, the user will either have to wait for a license to be available if a simulation is running, or use an additional seat license for the compilation. Thus, an organization will generally have to purchase additional seat licenses to avoid the downtime. Furthermore, the compilations are costly in terms of the design engineer's time and are a bottleneck in the validation process.

In light of the foregoing, it is desired to implement a scheme to validate a design for an integrated circuit in a more efficient manner thereby reducing overhead associated with machine/license resources due to the constant re-compilations.

SUMMARY OF THE INVENTION

Broadly speaking, the present invention fills these needs by providing a verification scheme where the task files are written as text files and are associated with a precompiled executable in order to eliminate the need for re-compiling the test case when tasks are adjusted. The present invention can be implemented in numerous ways, including as an apparatus, a system, a device, a computer readable media or a method. Several embodiments of the present invention are described below.

In one embodiment, a method for verifying an integrated circuit design is provided. The method initiates with defining tasks. The defined tasks are formatted as text files. Then, a test case is identified. The test case is defined by the tasks. Next, each of the tasks are correlated with a compiled task formatted in a hardware description language. Then, the compiled tasks are executed to simulate a behavior for the integrated circuit design to determine if a goal has been achieved. If the goal has not been achieved, the method includes adjusting the tasks of the test case and repeating the execution of the test case to simulate the behavior for the integrated circuit design.

In another embodiment, a method for minimizing compilation time of a test case during development testing of an integrated circuit is provided. The method initiates with identifying a test case. The test case is associated with the tasks and the tasks are written as text files. Then, a file associated with the test case is generated. Next, a sequence of the tasks of the file is determined. Then, hardware description language (HDL) tasks, associated with the tasks of the file according to the sequence, are identified. Next, a simulation of an integrated circuit is performed through the HDL tasks.

In still yet another embodiment, a computer readable media having program instructions for avoiding re-compilation of a test case during development testing of an integrated circuit is provided. The computer readable media includes program instructions for identifying a test case. The test case is associated with tasks written as text files. Program instructions for generating a file associated with the test case are provided. Program instructions for determining a sequence of the tasks of the file and program instructions for identifying hardware description language (HDL) tasks associated with the tasks of the file according to the sequence are included. Program instructions for performing a simulation of an integrated circuit with the HDL tasks are also provided.

In another embodiment, a computer system for validating an integrated circuit design is provided. The computer system includes a processor and a memory. A storage device is included. The storage device is configured to store compiled tasks written in a hardware description language (HDL) for testing the functional characteristics of an integrated circuit design. Each of the compiled tasks is associated with a corresponding text file. A bus enabling communication between the processor, the memory and the storage device is provided.

Other aspects and advantages of the invention will become apparent from the following detailed description, taken in conjunction with the accompanying drawings, illustrating by way of example the principles of the invention.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE PREFERRED EMBODIMENTS

An invention is described for a system, device and method for efficiently verifying a design of an integrated circuit (IC). It will be obvious, however, to one skilled in the art, that the present invention may be practiced without some or all of these specific details. In other instances, well known process operations have not been described in detail in order not to unnecessarily obscure the present invention. The term about as used to herein refers to +/−10% of the referenced value.

The embodiments of the present invention provide a method and system for performing the verification/validation of an IC design prior to implementing the design onto silicon. The verification/validation scheme described herein defines tasks which are applied to a model of the design to elicit a response. The tasks are text files which are correlated to a precompiled task formatted in a hardware description language (HDL). A translation layer associates the tasks formatted as text files with the precompiled tasks. Through the use of the tasks formatted as text files and the precompiled tasks, adjustments made to test cases during the design phase are implemented without the need to recompile the test cases.

Figure 1:
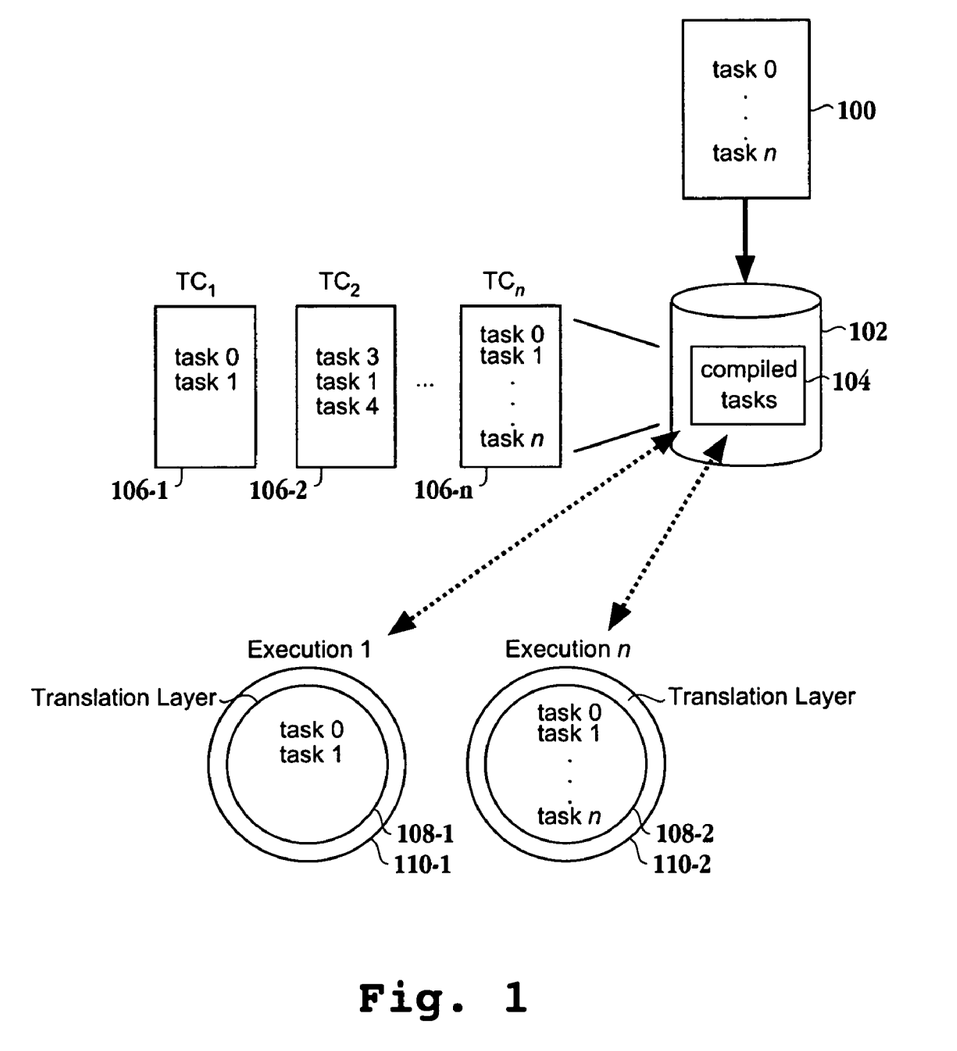
FIG. 1 is a high level simplified schematic diagram of a system configured to minimize the validation time of an integrated circuit in accordance with one embodiment of the invention.

FIG. 1 is a high level simplified schematic diagram of a system configured to minimize the validation time of an integrated circuit in accordance with one embodiment of the invention. Here, a list of tasks in block 100 are stored in storage media 102. It should be appreciated that the tasks are stored as compiled tasks 104 as will be explained in more detail below. From the list of tasks 100, a number of test cases (TC) may be generated. For example, $TC_1$ 106-1 includes task 0 and task 1 while $TC_2$ 106-2 includes task 3, task 1 and task 4. Likewise, $TC_n$ 106-n includes task 0, through task n. In one embodiment, the compiled tasks, also referred to as precompiled tasks, are compiled verilog files, e.g., a library of compiled files. Thus, when it is time to execute test case 1 for the validation of a chip design, task 0 and task 1, which make up test case 1, are executed in block 108-1. It should be appreciated that where necessary, translation layer 110-1 will translate the respective tasks in order for them to be executed. That is, the tasks are written as text files and associated with an executable verilog file. Thus, the translation layer associates each of the tasks of the text file with a corresponding verilog file. Similarly, for the execution of test case n, the respective tasks are executed in block 108-2 and translated through translation layer 110-2.

Figure 2:
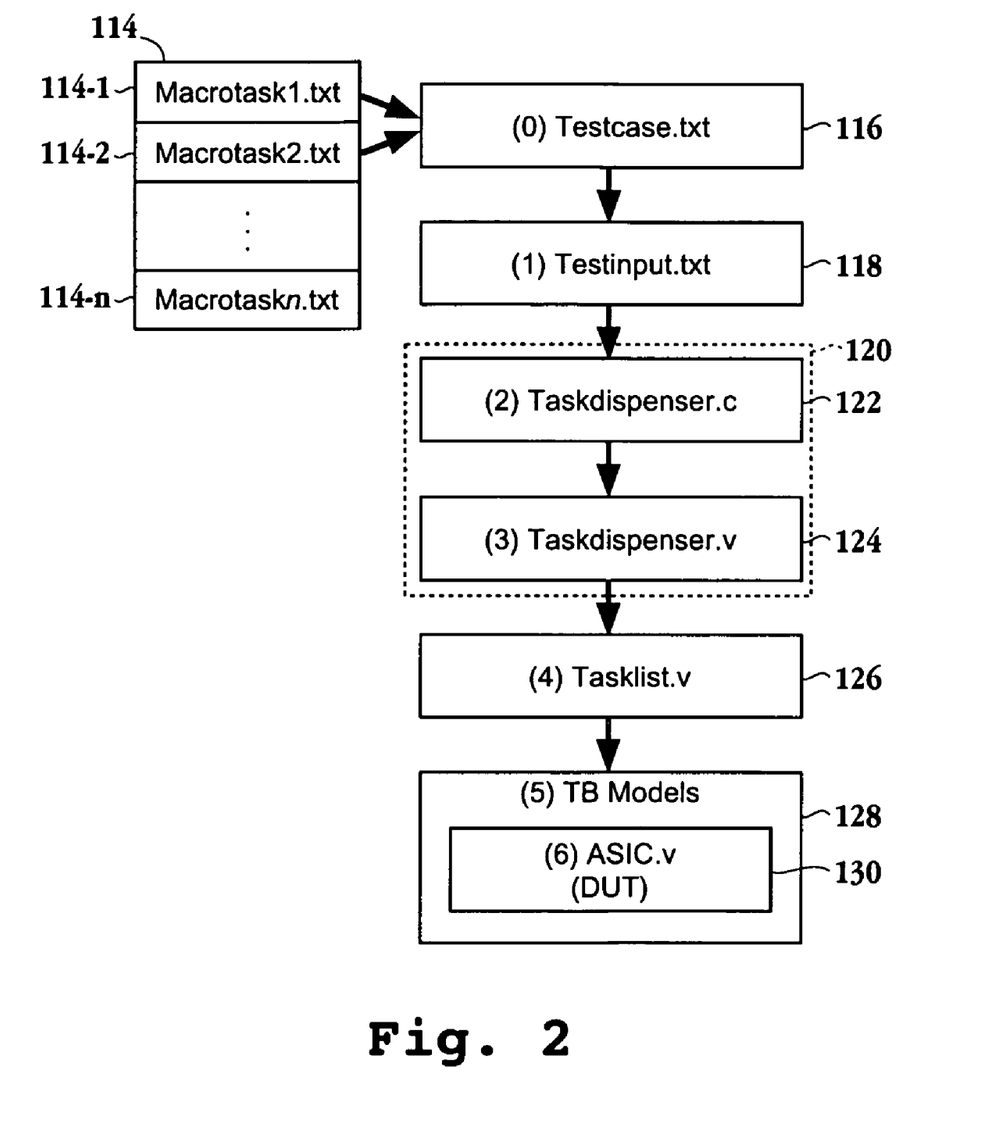
FIG. 2 is a simplified block diagram illustrating the test case execution flow in accordance with one embodiment of the invention.

FIG. 2 is a simplified block diagram illustrating the test case execution flow in accordance with one embodiment of the invention. Block 114 includes macro task 1 through macro task n. Each of the macro tasks, i.e., macro task 1 114-1 through macro task n 114-n include groups of tasks. In one embodiment, the groups of tasks for each macro task are commonly used tasks, e.g., an initialization command. It should be appreciated that each of the macro tasks of block 114 are text files. Block 116 represents a defined test case. Here, a test case may include individual tasks and any group of tasks, i.e., macro tasks from block 114. The test case of block 116 is written as an ascii text file. The ascii text file of block 116 is then preprocessed in block 118. Here, a testinput.txt file checks for correct syntax and format. In one embodiment, a script that is capable of reading the text file ensures that the text file is in the proper syntax and generates a verified file. The generated file from block 118, which has been verified, is then processed by block 122. It should be appreciated that blocks 122 and 124 correspond to translation layer 110 with reference to FIG. 1. In block 122 a generated file from the testinput.txt file of block 118 is analyzed in order to determine a sequence of tasks and identify the tasks to stimulate a model of the chip design. Taskdispenser.c 122 reads each line of the testinput.txt file from block 118 and passes the task name and its arguments to taskdispenser.c of block 124. It should be appreciated that taskdispenser.c of block 122 generates files formatted in a C language.

Still referring to FIG. 2, taskdispenser.v of block 124 then takes the task name and its arguments generated from block 122 and calls the appropriate tasks from tasklist.v in block 126. It should be appreciated that the taskdispenser.v file is a verilog file. Tasklist.v 126 is a precompiled list of verilog tasks in one embodiment of the invention. Thus, taskdispenser.v of block 124 correlates the task name from block 122 to the appropriate verilog file in tasklist.v of block 126. The correlated verilog file is then used to send stimuli to the test bench of block 128.

It will be apparent to one skilled in the art that the test bench model of block 128 of FIG. 2 represents the surrounding environment or architecture of the model of the appropriate device under test (DUT) 130, which may be a model of an application specific to integrated circuit (ASIC). Thus, test bench block 128 imitates the behavior of the system in which the device being designed will operate. As the simulation runs, input stimulus are applied to DUT 130 and outputs are monitored. Once the simulation has completed, a simulation output file is generated and analyzed to ensure tester timing and format constraints have not been violated as well as ensuring the device functionally performed as expected. It should be appreciated that blocks 122, 124, 126, 128 and 130 represent a single run time case. As can be seen from the schematic diagram of FIG. 2, there is no need to compile each time a task is adjusted or a test case is built. That is, there is one executable file sitting in one directory that is linked in order to provide the stimulation of the design of the integrated circuit.

Figure 3:
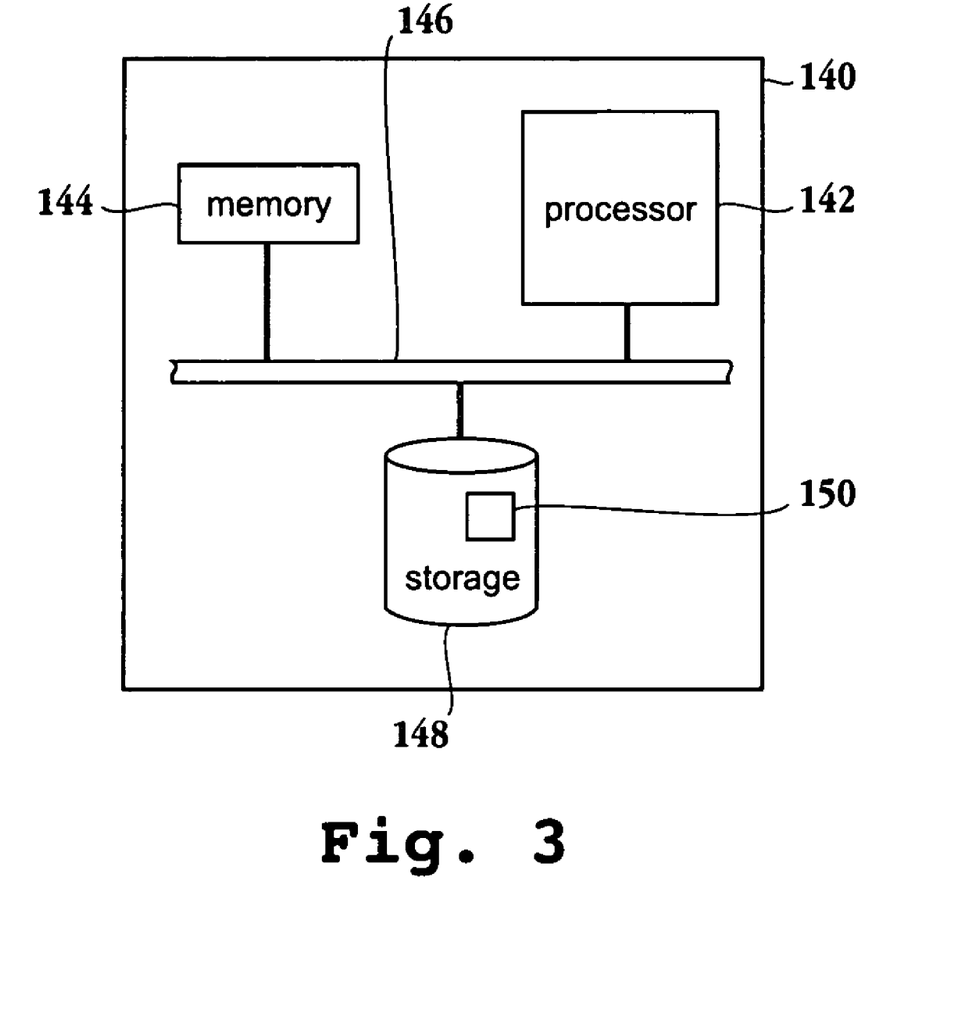
FIG. 3 is a simplified schematic diagram of a system which enables the efficient validation of a integrated circuit design in accordance with one embodiment of the invention.

FIG. 3 is a simplified schematic diagram of a system which enables the efficient validation of a integrated circuit design in accordance with one embodiment of the invention. In one embodiment, the system of FIG. 3 is a general computer system. System 140 includes processor 142, memory 144, storage media 148. Bus 146 enables communication between processor 142, memory 144 and storage media 148. Storage media 148 includes precompiled files 150. For example, precompiled files 150 represent the precompiled verilog tasks of tasklist.v 126 with reference to FIG. 2. As discussed herein, the precompiled files enable the avoidance of having to compile a test case each time a change to a task of the test case is made.

It will be apparent to one skilled in the art that during verification/validation of an IC design, the test cases may be modified numerous times, e.g., the specific tasks of a test case may be substituted with another task in order to generate a specific response. Accordingly, the storage of the compiled verilog files are linked to corresponding text files defining the tasks. It should be appreciated that the invention is not limited to verilog files, as any suitable hardware description language (HDL) may be used to define the precompiled files. One skilled in the art will appreciate that storage media 148 may located externally or internal to the system of FIG. 3. Furthermore, storage media 148 may be any suitable storage media for storing data. In addition, the storage media may be accessed through a network, either distributed or internal, so that the storage media may support a number of systems performing simulation operations associated with validation of a chip design.

Figure 4:
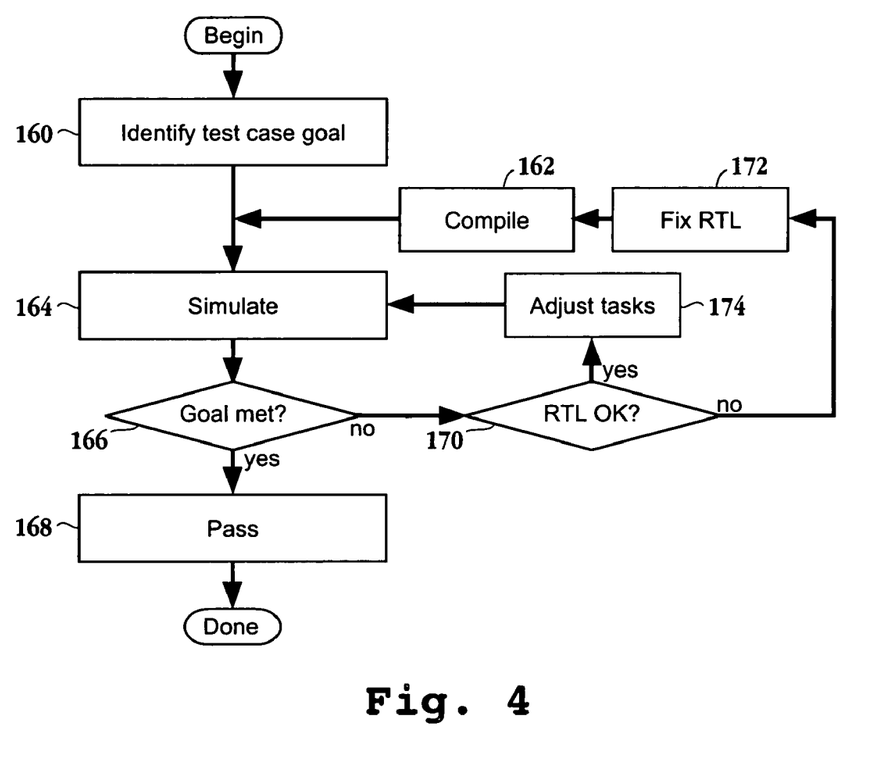
FIG. 4 is a flow chart diagram illustrating the method operations for efficiently validating a chip design in accordance with one embodiment of the invention.

FIG. 4 is a flow chart diagram illustrating the method operations for efficiently validating a chip design in accordance with one embodiment of the invention. The method initiates with operation 160 where the test case goals are identified. Here, a list of tasks may be assembled that stimulate a design of the integrated circuit in order to elicit a response captured through the simulation model. The method then advances to operation 164 where the tasks from the test case are used to simulate an activity. As discussed above, the tasks are correlated with a precompiled HDL file, e.g., verilog file, so that it is not necessary to compile each task. The method then proceeds to operation 166 where it is determined if the goal for the applicable test cases had been met. If the goal has been met, then the method proceeds to operation 168 where the chip design associated with that particular test case is passed.

If the goal has not been met in operation 166, the method moves to decision operation 170 where it is determined if the register transfer logic (RTL) is acceptable. If the RTL is not acceptable, the method advances to operation 172 where the RTL is fixed, i.e., repaired. The method then advances to operation 162 where the tasks from the repaired RTL are compiled. The compiled tasks are then used to simulate an activity of the chip design in operation 164 and proceeds as described above. If the RTL is acceptable in decision operation 170, then the method proceeds to operation 174 where the tasks are adjusted. For example, some tasks may be eliminated and replaced with other tasks, or some tasks may be added to the test case. The test case with the adjusted tasks are then used to run the simulation in operation 164 without the need for compiling the testcase and the method proceeds as described above.

Figure 5:
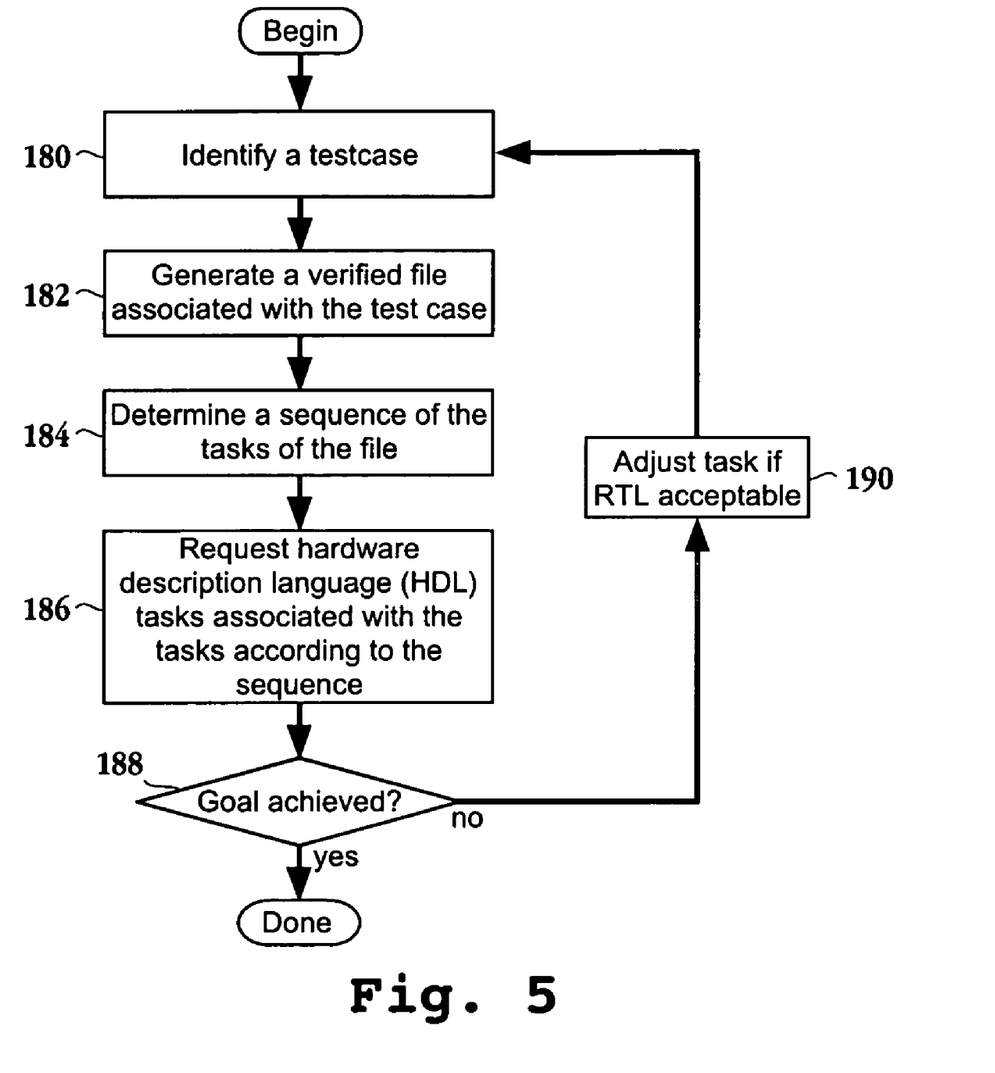
FIG. 5 is a flowchart diagram representing the method operations for minimizing compilation time of a test case during development testing of an integrated circuit in accordance with one embodiment of the invention.

FIG. 5 is a flowchart diagram representing the method operations for minimizing compilation time of a test case during development testing of an integrated circuit in accordance with one embodiment of the invention. The method initiates with operation 180 where a test case is identified. For example, the test case may include a number of macro tasks and individual tasks as discussed with reference to FIG. 2. Here, the test case is formatted as a text file. The method then advances to operation 182 where a verified file associated with the test case is generated. In one embodiment, the file is verified as to syntax and format by a script which reads the test case text file of operation 180. For example, the testinput.txt block of FIG. 2 may perform this functionality. The method then proceeds to operation 184 where a sequence of tasks of the file is determined. In one embodiment, the verified file is read line by line to identify the sequence of tasks.

The method of FIG. 5 then moves to operation 186 where hardware description language (HDL) tasks associated with the tasks of the file are requested according to the sequence of the file determined in operation 184. Here, the hardware description language tasks are verilog files that have been pre-compiled and stored. For example, the verilog files may be stored in a library of files such as the tasklist.v with reference to FIG. 2. In one embodiment, a translation layer, such as the translation layer with reference to FIG. 2, correlates the text based tasks to hardware description language based tasks. The method then moves to decision operation 188 where it is determined if a goal associated with the HDL task has been achieved. Here, a design of the integrated circuit is tested according to a simulation in order to determine if a correct response was achieved when executing the test case. If the goal has been achieved, then the design associated with the applicable test case is accepted. If the goal has not been achieved, then the tasks are adjusted in operation 190 if the RTL is acceptable, and operations 180 through 188 are repeated as described above. If the RTL is not acceptable, then the RTL is repaired as discussed with reference to FIG. 4. It should be appreciated that the need to compile each test case when it is adjusted is eliminated by the embodiments described herein.

Figure 6:
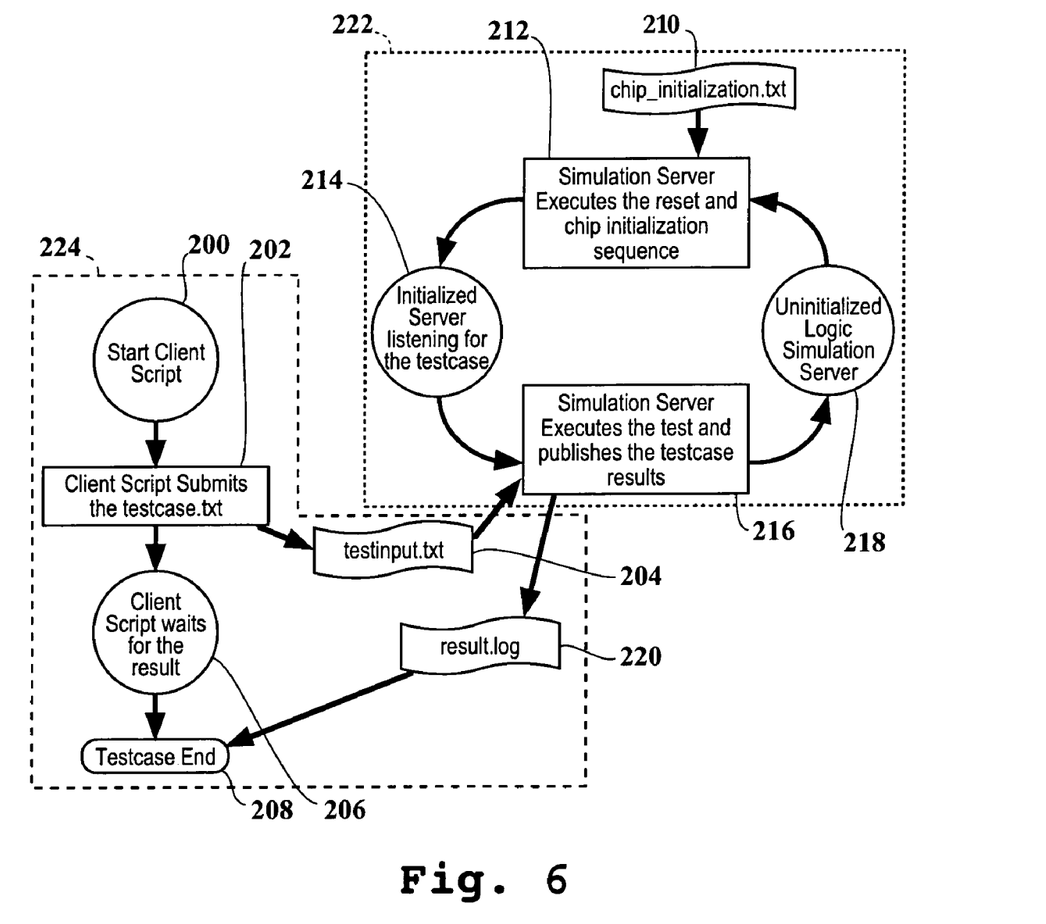
FIG. 6 is a block diagram illustrating the execution flow for a client server system configured to accelerate test case development in accordance with one embodiment of the invention.

FIG. 6 is a block diagram illustrating the execution flow for a client server system configured to accelerate test case development in accordance with one embodiment of the invention. The client server system includes two main components, i.e. server component 222 and client component 224. Client component 224 executes client script 200. In one embodiment, client component 224 is configured to read a text file. In block 202 the client script, which was initiated in block 200, submits the test case. The test case may include a group of tasks, i.e., macro tasks. The tasks associated with the test case is written as a text file. It should be appreciated that since the initialization sequence is stored on the server side, the initialization sequence is not needed as part of the test case being submitted to server component 222. The client script then creates a testinput.txt file which is used to submit to server component 222 and the client script then waits for the result of the server execution as illustrated in block 206.

The testinput.txt file of block 204 of FIG. 6 is a preprocessed file in which syntax and format errors associated with the testcase.txt file have been checked. Thus, a verified file is generated that is then moved to the data stream where the server component 222 is running. In one embodiment, testinput.txt of block 204 includes text-based tasks associated with precompiled hardware description language based tasks. Server component 222 maintains the server in an initialized state as mentioned above. Here, chip initialization text of block 210 is executed by a simulation server. The simulation server executes the re-set and chip initialization sequence in block 212. The initialized server is maintained in the initialized state, awaiting for a test case to be delivered from client side 224 as illustrated in block 214. Thus, when the testinput.txt file block 204 is moved into the data stream of the server component 222, the simulation server is available to immediately process and execute the test case associated with the testinput.txt file. Accordingly, the simulation server executes the test and publishes the test case results in block 216.

Once the test has completed, the simulation server is uninitialized in block 218 of FIG. 6. The chip initialization test is then re-run in order to initialize the simulation server and the process is repeated as illustrated on the server component 222 of FIG. 6. Upon completion of the test case in block 216, the server moves the test case results to the client side as a result.log in block 220. The result.log of block 220 is then communicated to the client script which is waiting in block 206. Thus, the system described above eliminates the need for waiting for any database to be linked or the need for re-setting the chip and completing the initialization sequence prior to executing the test case In summary, the present invention provides a scheme for efficient verification/validation of a IC design. The tasks defining test cases that provide stimulation of a DUT are written as text files. The test cases are each verified in order to identify syntax and format errors. Each of the tasks of the test cases are correlated to a compiled file written in a HDL. A translation layer provides the correlation to the appropriate compiled file from the task written as a text file. Thus, where changes occur to the tasks of the test cases, as is common during the design phase, compilation of the test case is avoided. Additionally, fewer seat licenses are required as a result of minimizing the compiling requirements.

With the above embodiments in mind, it should be understood that the invention may employ various computer-implemented operations involving data stored in computer systems. These operations include operations requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

The above described invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a communications network.

The invention can also be embodied as computer readable code on a computer readable medium. The computer readable medium is any data storage device that can store data which can be thereafter read by a computer system. The computer readable medium also includes an electromagnetic carrier wave in which the computer code is embodied. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for verifying an integrated circuit design, comprising:
    defining tasks, the tasks being formatted as .txt files;
    identifying a test case, the test case being defined by the tasks;
    correlating each of the tasks with a compiled task formatted in a hardware description language,
    executing the compiled task to simulate a behavior for the integrated circuit design, the executing occurring on a simulation server maintained in an initialized state to immediately execute the compiled task and which publishes results to determine if a goal has been achieved, wherein a chip initialization text file is executed on the simulation server to maintain the initialized state;
    if the goal has not been achieved, the method includes adjusting the tasks of the test case; and
    repeating the executing of the test case to simulate the behavior for the integrated circuit design.

2. The method of claim 1, wherein the hardware description language is verilog.

3. The method of claim 1, further comprising:
    grouping the defined tasks as macrotasks.

4. The method of claim 1, wherein the method of identifying a test case includes,
    verifying a syntax and a format of each of the tasks of the test case.

5. A method for minimizing compilation time of a test case during development testing of an integrated circuit, comprising:
    identifying a test case, the test case associated with tasks written as .txt files, the tasks omitting an initialization sequence of a chip model;
    generating a file associated with the test case;
    determining a sequence of the tasks of the file;
    identifying hardware description language (HDL) tasks associated with the tasks of the file according to the sequence; and
    performing a simulation of the integrated circuit with the HDL tasks, the performing occurring on a simulation server maintained in an initialized state to immediately process and execute a compiled task and which publishes results to determine if a goal has been achieved, wherein a chip initialization text file is executed on the simulation server to maintain the initialized state.

6. The method of claim 5, wherein the HDL tasks are pre-compiled.

7. The method of claim 6, wherein the HDL tasks are stored in a library of HDL tasks on storage media in communication with a system performing the simulation.

8. The method of claim 5, wherein the method of generating a file associated with the test case includes,
   verifying the file associated with the test case as to a syntax and a format of each of the tasks associated with the test case.

9. The method of claim 8, wherein a script performs the verification of the file associated with the test case.

10. The method of claim 5, wherein the method of identifying hardware description language (HDL) tasks associated with the tasks of the file according to the sequence includes,
    accessing a translation layer to correlate the tasks of the file with the HDL tasks.

11. The method of claim 5, wherein the HDL is verilog.

12. A computer readable medium having program instructions for avoiding re-compilation of a test case during development testing of an integrated circuit, comprising:
    program instructions for identifying a test case, the test case associated with tasks written as .txt files, the tasks omitting an initialization sequence of a chip model;
    program instructions for generating a file associated with the test case;
    program instructions for determining a sequence of the tasks of the file;
    program instructions for identifying hardware description language (HDL) tasks associated with the tasks of the file according to the sequence; and
    program instructions for performing a simulation of the integrated circuit with the HDL tasks, the performing occurring on a simulation server maintained in an initialized state to immediately execute a compiled task and which publishes results to determine if a goal has been achieved, wherein a chip initialization text file is executed on the simulation server to maintain the initialized state.

13. The computer readable medium of claim 12, wherein the program instruction for generating a file associated with the test case includes,
    program instructions for verifying the file associated with the test case as to a syntax and a format of each of the tasks associated with the test case.

14. The computer readable medium of claim 13, wherein the program instructions for verifying the file associated with the test case as to a syntax and a format of each of the tasks associated with the test case include,
    executing a script capable of reading the file associated with the test case.

15. The computer readable medium of claim 12, wherein the program instructions for identifying hardware description language (HDL) tasks associated with the tasks of the file according to the sequence include,
    program instructions for accessing a translation layer to correlate the tasks of the file with the HDL tasks.

16. The computer readable medium of claim 12, wherein the HDL tasks are pre-compiled.

17. A computer system for validating an integrated circuit design, comprising:
    a processor;
    a memory;
    a storage device; the storage device configured to store compiled tasks written in a hardware description language (HDL) for testing the functional characteristics of the integrated circuit design, each of the compiled tasks associated with a corresponding .txt file, the contents of which do not include an initialization sequence of a chip model, wherein the compiled tasks are configured to be executed on a server component maintained in an initialized state facilitating immediate execution of the compiled tasks and, wherein a chip initialization text file is executed on the server component to maintain the initialized state; and
    a bus enabling communication between the processor, the memory and the storage device.

18. The computer system of claim 17, wherein the storage device is externally located from the system.

19. The computer system of claim 17, wherein the corresponding .txt file is verified as to syntax and format.

20. The computer system of claim 17, wherein the HDL is verilog.

* * * * *